(12) United States Patent
Wang et al.

(10) Patent No.: US 11,680,994 B2
(45) Date of Patent: Jun. 20, 2023

(54) DETECTION DEVICE, WIRE PROCESSING EQUIPMENT AND METHOD FOR DETECTING POSITION OF CONDUCTOR

(71) Applicants: TYCO ELECTRONICS (SHANGHAI) CO., LTD., Shanghai (CN); TE CONNECTIVITY GERMANY GMBH, Bensheim (DE)

(72) Inventors: Zhen Wang, Shanghai (CN); Yiqun (Cham) Zhu, Shanghai (CN); Siegfried Beck, Feuchtwangen (DE)

(73) Assignees: TE CONNECTIVITY SERVICES GMBH, Schaffhausen (CH); TYCO ELECTRONICS (SHANGHAI) CO. LTE, Shanghai (CN)

( * ) Notice: Subject to any disclaimer, the term of this patent is extended or adjusted under 35 U.S.C. 154(b) by 0 days.

(21) Appl. No.: 17/357,167

(22) Filed: Jun. 24, 2021

(65) Prior Publication Data
US 2021/0405127 A1    Dec. 30, 2021

(30) Foreign Application Priority Data
Jun. 30, 2020 (CN) .......................... 202010617413.X

(51) Int. Cl.
*G01R 31/58* (2020.01)
*H01B 13/00* (2006.01)

(52) U.S. Cl.
CPC ......... *G01R 31/58* (2020.01); *H01B 13/0036* (2013.01)

(58) Field of Classification Search
CPC ............................ G01R 31/58; H01B 13/0036
See application file for complete search history.

(56) References Cited

U.S. PATENT DOCUMENTS 3,148,711 A * 9/1964 William ............... H02G 1/1248
  81/9.51
4,622,733 A * 11/1986 Fukuda .................. H01R 43/05
  29/748

(Continued)

FOREIGN PATENT DOCUMENTS

CN  110320449 A * 10/2019
JP  H0972940 A * 3/1997

*Primary Examiner* — Feba Pothen

(57) ABSTRACT

The present invention relates to a detection device for detecting a position of a conductor, a wire processing equipment, and a method for detecting a position of a conductor in wire processing. The detection device has: a bracket; and a plurality of conductive probes provided on the bracket and spaced from each other. The conductive probes have a detection position, and the detection device is configured to determine whether the detected conductor is at a predetermined position by detecting whether the conductive probes at the detection position are electrically connected through the conductor; when at least two conductive probes are electrically connected with each other through the detected conductor, the detected conductor is determined in the predetermined position; when no two conductive probes are electrically connected with each other through the detected conductor, the detected conductor is determined not in the predetermined position. The detection device for detecting the position of the conductor, the wire processing equipment and the method for detecting the position of the conductor in the wire processing of the invention can automatically detect whether the conductor is in the designated position, which provides a basis for further automatic processing of the wire.

15 Claims, 4 Drawing Sheets

(56) References Cited

U.S. PATENT DOCUMENTS 4,764,662 A * 8/1988 Andersen ................. H01R 4/72
392/416
2016/0260528 A1* 9/2016 Widaj .................... H01B 13/06

* cited by examiner

DETECTION DEVICE, WIRE PROCESSING EQUIPMENT AND METHOD FOR DETECTING POSITION OF CONDUCTOR

CROSS-REFERENCE TO RELATED APPLICATION

This application claims the benefit of Chinese Patent Application No. 202010617413.X filed on Jun. 30, 2020 in the State Intellectual Property Office of China, the whole disclosure of which is incorporated herein by reference.

BACKGROUND OF THE INVENTION

Field of the Invention

The present invention relates to a detection device for detecting a position of a conductor, a wire processing equipment, and a method for detecting a position of a conductor in wire processing.

Description of the Related Art

When splicing two bundles of wires, it is necessary to cut off a section of insulation layer of two bundles of wires and expose part of conductors respectively. The exposed conductors of two bundles of wires are welded, and then a section of insulating heat shrinkable tube is wrapped on the exposed conductors. In the process of automatic processing, two bundles of wires need to be fixed and the exposed conductors are required to be in the predetermined position, so as to wrap the exposed conductors with the insulating heat shrinkable tube. How to detect and judge whether the conductors are in the predetermined position is one of the technical problems to be solved in the art.

SUMMARY OF THE INVENTION

The present invention has been made to overcome or alleviate at least one aspect of the above mentioned disadvantages.

According to an aspect of the present invention, there is provided a detection device for detecting a position of a conductor. The detection device comprises of: a bracket; and a plurality of conductive probes provided on the bracket and spaced from each other. The conductive probes have a detection position, and the detection device is configured to determine whether the detected conductor is at a predetermined position by detecting whether the conductive probes at the detection position are electrically connected through the conductor; when at least two conductive probes are electrically connected with each other through the detected conductor, the detected conductor is determined in the predetermined position; when no two conductive probes are electrically connected with each other through the detected conductor, the detected conductor is determined not in the predetermined position.

According to an exemplary embodiment of the present invention, the detection device further comprises a detection circuit electrically connected with the conductive probes; when at least two conductive probes are in contact with the detected conductor, the detection circuit is connected, and the detected conductor is determined in the predetermined position; when no two conductive probes are in contact with the detected conductor, the detection circuit is disconnected, and the detected conductor is determined not in the predetermined position.

According to another exemplary embodiment of the present invention, the detection circuit is in electrical contact with the conductive probes.

According to another exemplary embodiment of the present invention, the detection device further comprises a swing mechanism supported on the bracket and comprising a swing arm, the conductive probes are connected to the swing arm, the swing arm is configured to swing to drive the conductive probes to move toward or away from the detection position.

According to another exemplary embodiment of the present invention, the conductive probes are in electrical contact with the swing arm, the swing arm is electrically connected with the detection circuit.

According to another exemplary embodiment of the present invention, the conductive probes and the swing arm are configured to be movable relative to each other.

According to another exemplary embodiment of the present invention, the detection device further comprises an elastic reset device for holding the conductive probes in an initial state; after the conductive probes deviate from the initial state relative to the swing arm, the elastic reset device resets the conductive probes to the initial state.

According to another exemplary embodiment of the present invention, the conductive probes are rotatably arranged on the swing arm relative to the swing arm through a first pin shaft; the elastic reset device is a tension spring, one end of which is connected to the swing arm, and the other end is connected to the conductive probes; after the conductive probes deviate from the swing arm, the extension spring resets the conductive probes.

According to another exemplary embodiment of the present invention, the detection device further comprises a main shaft rotatably supported on the bracket, the swing mechanism also comprises a mounting seat and a driving device, the mounting seat is rotatably supported on the main shaft and fixedly connected with the swing arm; the driving device drives the swing arm to swing by directly driving the mounting seat or by driving the mounting seat through a transmission mechanism.

According to another exemplary embodiment of the present invention, the swing mechanism further comprises: a transmission block rotatably mounted on the main shaft; and a secondary shaft passes through the transmission block and the mounting seat so that the transmission block and the mounting seat are provided in circumferential linkage, the driving device directly drives the transmission block to rotate or drives the transmission block to rotate through a transmission mechanism, the mounting seat is driven to rotate when the transmission block is rotated, and the swing arm is driven to swing when the mounting seat is rotated.

According to another exemplary embodiment of the present invention, the swing mechanism comprises a plurality of mounting seats respectively arranged on both sides of the transmission block for mounting the swing arm, the plurality of mounting seats are matched and connected with the main shaft through reverse threads; when the main shaft is rotated, the mounting seats on both sides of the transmission block drives the swing arm to move close to or away from each other.

According to another exemplary embodiment of the present invention, a compression spring is sleeved on the main shaft, one end of the compression spring butts against the bracket, and the other end butts against the mounting seat.

According to another exemplary embodiment of the present invention, the driving device is an air cylinder, and the air cylinder is rotatably provided through a second pin shaft;

the air cylinder is provided with a retractable piston rod, and the piston rod is rotatably connected with the transmission block; the transmission block and the main shaft are driven to rotate when the piston rod extends or retracts, and the transmission block drives the mounting seat to rotate through the secondary shaft when the transmission block is rotated.

According to another aspect of the present invention, there is provided a wire processing equipment, comprising: a wire processing device; and the above detection device, the detection device is used for detecting position of a conductor of the wire before the wire is processed.

According to an exemplary embodiment of the present invention, the wire processing device is a wire heat shrinkable machine; when the detection device determines that the detected wire is in the predetermined position, the conductive probes move away from the detection position to allow the wire to be processed by the wire heat shrinkable machine.

According to another aspect of the present invention, there is provided a method for detecting position of a conductor in wire processing, comprising steps of:

S100: fixing a wire to be processed, wherein the wire has an exposed conductor; and S200: detecting whether the exposed conductor is in a predetermined position, wherein if the exposed conductor is not in the predetermined position, the position of the exposed conductor is adjusted and detected again until the exposed conductor is in the predetermined position.

According to an exemplary embodiment of the present invention, the step S200 comprising: providing a detection circuit, wherein when the wire is in the predetermined position, the detection circuit is electrically connected with the exposed conductor; and detecting whether the detection circuit is connected to determine whether the processed wire is in the predetermined position.

The present invention relates to a detection device for detecting the position of a conductor, a wire processing device and a method for detecting the position of a conductor during wire processing. A plurality of conductive probes is provided in the detection circuit. When the conductor is in the predetermined position, the plurality of conductive probes can contact with the conductor, and the plurality of conductive probes can be electrically connected through the conductor, then the detection circuit is connected; If the conductor is not in the predetermined position, then the conductive probes cannot all contact the conductor, and the detection circuit is disconnected. Therefore, according to whether the detection circuit is connected or disconnected, it can be determined whether the conductor is in the predetermined position. Whether the detection circuit is connected or not can be prompted by light and sound devices, for example, the detection circuit is provided with a light or a sound alarm. If the detection circuit is connected, the lamp will light up or the sound alarm will sound to prompt the operator that the detection circuit is connected. In addition, the electrical signal of the detection circuit can be used as the condition for the next step of processing. The detection circuit is connected and outputs the electrical signal, and the upper computer controls the next step of processing equipment to continue to work according to the electrical signal; If the detection circuit is not connected, the electrical signal will not be output, and the upper computer controls the next processing equipment not to work.

The detection device for detecting the position of the conductor, the wire processing equipment and the method for detecting the conductor position in the wire processing of the invention can automatically detect whether the conductor is in the predetermined position, which provides a basis for further automatic processing of the wire. By swinging the conductive probes through the swinging mechanism, the conductive probes can be swung to the detection position and moved away from the detection position after the detection, so as to avoid the influence of the conductive probes on the next processing operation. The conductive probes and the swing arm can be set relatively movably. In the detection, if the pressure of the conductive probes against the conductor is too large, the conductive probes may move relative to the swing arm, which can not only make the conductive probes and the conductor contact closely, but also avoid the conductor or the conductive probes from being damaged due to the excessive force exerted by the conductive probes on the conductor. The elastic reset device can help the conductive probes reset, and it will not be unable to continue the detection due to the movement of the conductive probes relative to the swing arm. The elastic reset device adopts an extension spring, which makes the structure of the invention simple and easy to implement. As the support structure of the swing arm, the main shaft makes the swing arm swing and can be installed. The structure is simple and easy to implement. The installation seat and the transmission block can be linked circumferentially by setting the auxiliary shaft, so that the technical scheme of the invention can be implemented. The mounting seats are respectively arranged on both sides of the transmission block, and are respectively connected with the main shaft through the reverse threads, so that the spacing of the mounting seats can be adjusted when the main shaft rotates. The main shaft is equipped with a compression spring, which can eliminate the thread gap, keep the position stable, and avoid shaking in the detection and affect the detection effect. The air cylinder is used as the driving device, which is easy to implement and simple in structure.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS

Figure 1:
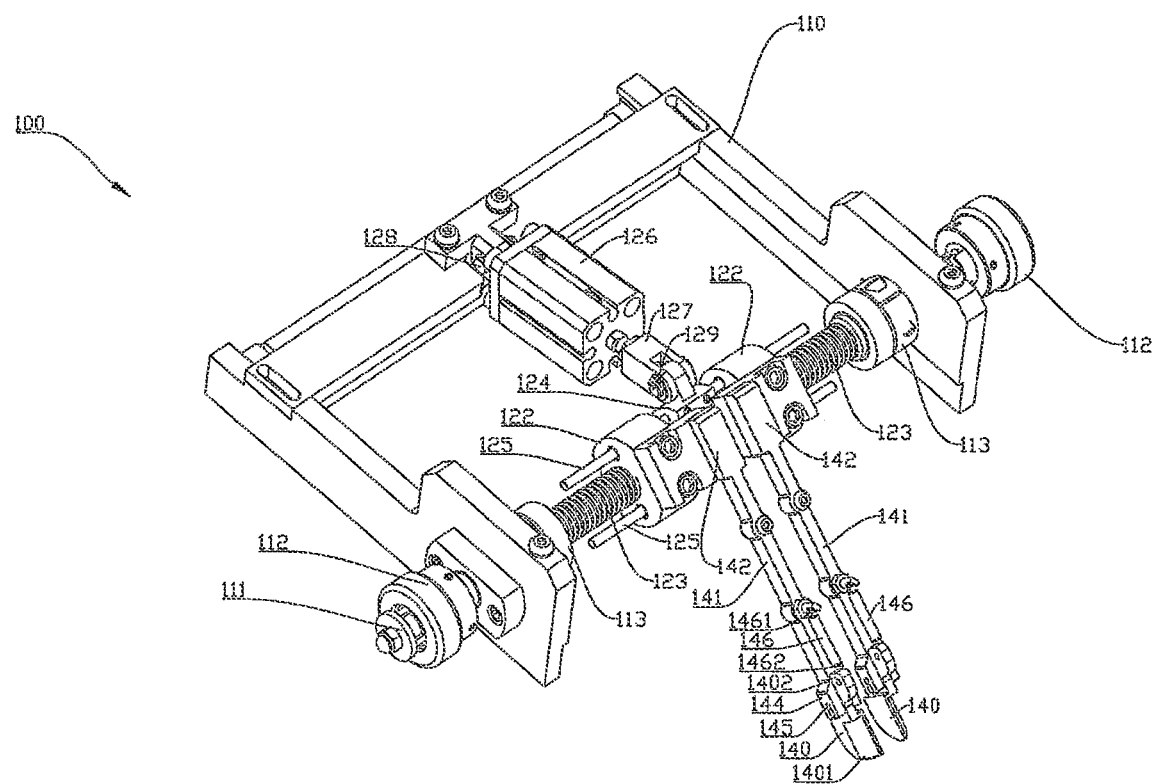
FIG. 1 is an illustrative structural view of a detection device for detecting the position of a conductor according to an exemplary embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present invention, there is provided a detection device for detecting a position of a conductor. The detection device comprises of: a bracket; and a plurality of conductive probes provided on the bracket and spaced from each other. The conductive probes have a detection position, and the detection device is configured to determine whether the detected conductor is at a predetermined position by detecting whether the conductive probes at the detection position are electrically connected through the conductor; when at least two conductive probes are electrically connected with each other through the detected conductor, the detected conductor is determined in the predetermined position; when no two conductive probes are electrically connected with each other through the detected conductor, the detected conductor is determined not in the predetermined position.

Figure 2:
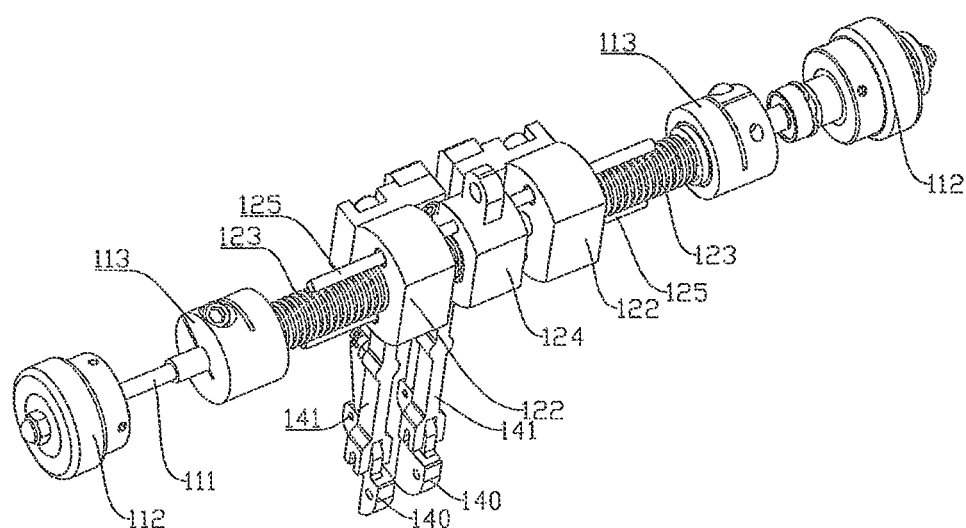
FIG. 2 is an illustrative partial structure view of the detection device for detecting the conductor position according to an exemplary embodiment of the present invention.
Figure 3:
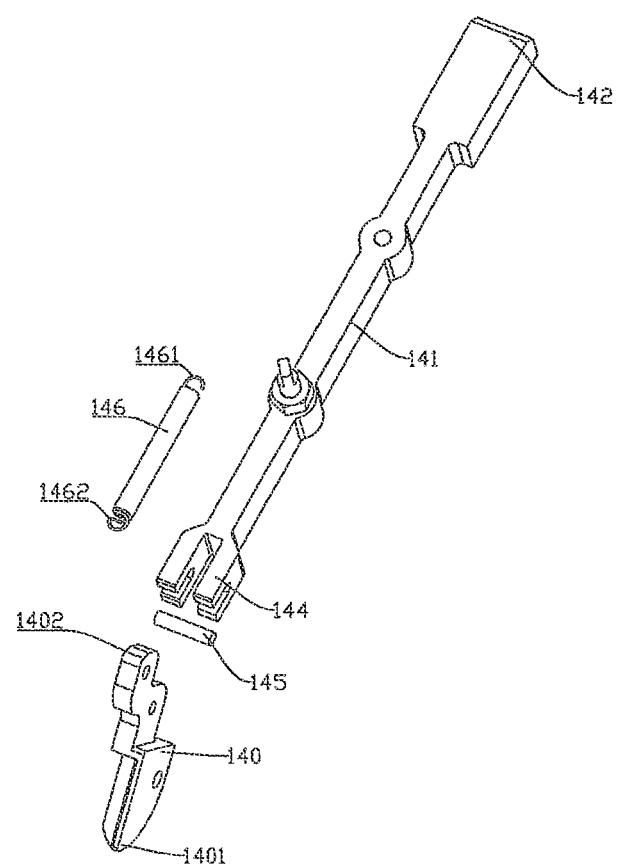
FIG. 3 is an illustrative structural view of a swing arm and conductive probes according to an exemplary embodiment of the present invention.
Figure 4:
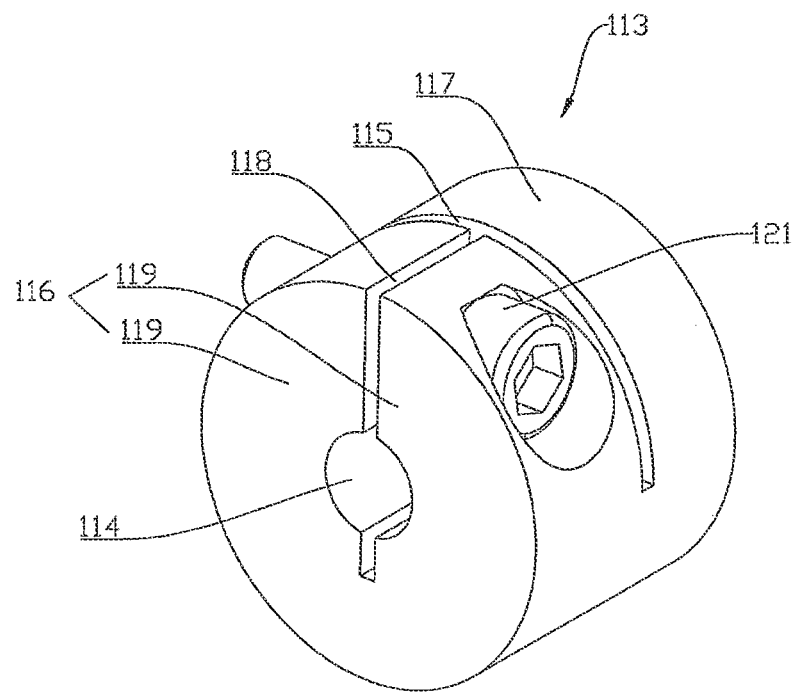
FIG. 4 is an illustrative structural view of a locking block according to an exemplary embodiment of the present invention.

As shown in FIGS. 1-3, a detection device 100 for detecting a conductor position includes a bracket 110, a conductive probe 140, and a detection circuit 150. The bracket 110 is used to support other structures, and the specific structure can be determined according to other components. In the illustrated embodiment, the bracket 110 is approximately U-shaped. The main shaft 111 is mounted on the bracket 110. The main shaft 111 is rotatably mounted on the bracket 110. The two ends of the main shaft 111 are respectively connected with handles 112. The handle 112 is located on the outside of the bracket 110. The main shaft 111 is also provided with a locking block 113. The locking block 113 is fitted on the main shaft 111. The locking block 113 is used for supporting one end of the compression spring 123. Its structure can be selected, which is adapted to be fixed on the main shaft 111 and is suitable for supporting the compression spring 123. Preferably, the locking block 113 is arranged in a position adjustable on the main shaft 111. The position of the locking block 113 on the main shaft 111 can be adjusted to adapt to different compression springs, and the elastic force of the compression spring 123 can be adjusted to achieve the best effect of the compression spring 123. In the example shown in FIG. 4, the locking block 113 is cylindrical. The locking block 113 is fitted on the main shaft 111. The locking block 113 is provided with an axial through hole 114. The locking block 113 is provided with a first notch 115. The first notch 115 extends radially to the axial through hole 114 so that the locking block 113 forms the first bump 116 and the second bump 117 connected with each other. The first bump 116 is provided with a second notch 118. The second notch 118 extends radially to the axial through hole 114 and divides the first bump 116 into two connected sub bumps 119. The screw 121 is matched with the thread of the sub bump 119 to connect the two sub bumps 119. The second notch 118 can be opened or closed by screwing the screw 121 so that the two sub bumps 119 are close or far away. When the locking block 113 is in a proper position, the two sub bumps 119 can clamp the main shaft 111 by turning the screw 121 to fix the locking block 113 in this position. To adjust the position of the locking block 113, the screw 121 may be turned to reduce the clamping force of the two sub bumps 119 on the main shaft 111. After the locking block 113 can be moved, its position on the main shaft 111 can be adjusted.

The main shaft 111 is provided with two sections of reverse threads (not shown), and the rotation directions of the two sections of reverse threads are opposite. Two mounting seats 122 are arranged on the main shaft 111. The two mounting seats 122 are respectively provided with two sections of reverse threads to fit with the main shaft 111 threads. Because the reverse threads are used to cooperate with the mounting seats 122, when the mounting seats 122 are not rotated and the main shaft 111 is rotated, the two mounting seats 122 will be moved close to each other or away from each other. With this setting, the spacing between the two mounting seats 122 can be adjusted. The main shaft 111 is equipped with two compression springs 123. Each compression spring 123 is located between one of the mounting seats 122 and the locking block 113. One end of the compression spring 123 is against the locking block 113, and the other end is against the mounting seat 122. After being compressed, the compression spring 123 has elastic force, which acts on the mounting seat 122 and helps to keep the mounting seat 122 stable.

The main shaft 111 is also equipped with a transmission block 124. The transmission block 124 is rotatable. The transmission block 124 is located between two mounting seats 122. The secondary shaft 125 passes through the two mounting seats 122 and the transmission block 124 to make the two mounting seats 122 and the transmission block 124 circumferentially linked, that is, when one of the three rotates, the other two can be driven to rotate through the secondary shaft 125. In the illustrated embodiment, there are two secondary shafts 125, and the two secondary shafts 125 are spaced.

The detection device 100 for detecting the position of the conductor in the present invention also includes a driving device. The driving device is used for driving the transmission block 124 to rotate. In the illustrated embodiment, the driving device is an air cylinder 126. The air cylinder 126 has a piston rod 127. The piston rod 127 is retractable. The cylinder 126 is connected with the bracket 110 through a second pin 128 and can rotate around the second pin 128. The piston rod 127 is connected with the transmission block 124 through a third pin 129. The piston rod 127 and the transmission block 124 can rotate relative to each other. When the piston rod 127 extends or retracts, the transmission block 124 is pulled to rotate around the main shaft 111. When the transmission block 124 rotates, the secondary shaft 125 drives the two mounting seats 122 to rotate around the main shaft 111.

The detection device 100 for detecting the position of the conductor in the present invention also includes a swing arm 141. The swing arm 141 is used to install the conductive probes 140 and is connected with the mounting seats 122 to drive the conductive probes 140 to swing. The swing arm 141 is a rod-shaped structure. One end 142 of the swing arm 141 is connected with and electrically isolated from the mounting seats 122, and the other end is connected with the conductive probes 140. The conductive probes 140 are rotatably connected to the swing arm 141 and may be rotated relative to the swing arm 141. In the preferred example as shown in the figure, the other end of the swing arm 141 is provided with a U-shaped frame 144. The U-shaped frame 144 is provided with a first pin shaft 145.

The structure of the conductive probes 140 are suitable for connecting with the swing arm 141 and contacting with the bare conductor of the wire. The conductive probe 140 extends from one end 1401 to the other end 1402. The middle part of the conductive probe 140 is located in the U-shaped frame 144. One end 1401 and the other end 1402 of the conductive probe 140 protrude out of the U-shaped frame 144 toward both sides respectively. The first pin 145 passes through the conductive probe 140. The conductive probe 140 may rotate about the first pin 145. The conductive probe 140 is in contact with the swing arm 141 to electrically connect with the swing arm 141. The swing arm 141 is also provided with an elastic reset device for keeping the conductive probe 140 in the initial state. When the conductive probe 140 moves away from the initial state relative to the swing arm 141, the elastic reset device is used to reset the conductive probe 140. In the illustrated embodiment, the elastic reset device is an extension spring 146. One end 1461 of the extension spring 146 is connected to the swing arm 141, and the other end 1462 is connected to the other end 1402 of the conductive probe 140. When the conductive probe 140 rotates relative to the swing arm 141, the extension spring 146 is elongated to generate elastic force, which can help the conductive probe 140 reset.

In the illustrated embodiment, two swing arms 141 and two conductive probes 140 are provided. As the distance between the two mounting seats 122 increases or decreases, the distance between the two conductive probes 140 also increases or decreases.

In the above embodiments, the air cylinder 126, the transmission block 124, the secondary shaft 125, the mounting seat 122 and the swing arm 141 constitute a swing mechanism for driving the conductive probe 140 to swing. When the conductive probe 140 swings, it can swing to the detection position.

Figure 5:
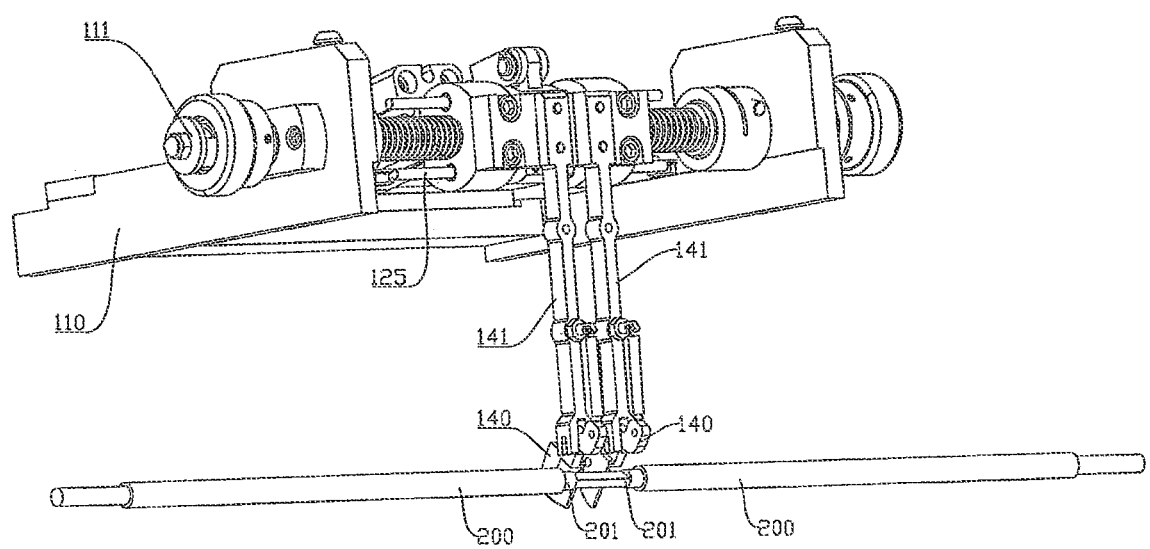
FIG. 5 is an illustrative view of a use state of a detection device for detecting position of a conductor according to an exemplary embodiment of the present invention.

As shown in FIG. 5, when the present invention is used to detect the conductor position, the two bundles of wires 200 have some exposed conductors respectively, and the exposed conductors 201 of the two bundles of wires 200 are connected, and then the connected wires 200 are placed in the processing position. The air cylinder 126 drives the swing arm 141 to swing around the main shaft 111 through the transmission block 124, the auxiliary shaft and the mounting seat 122, and swings the conductive probe 140 to the detection position. The detection position is located on the swing path of the conductive probe 140, which can be any position suitable for subsequent processing. According to the predetermined condition, at the detection position, all the conductive probes 140 can contact with the exposed conductor 201 and be electrically connected through the exposed conductor 201 to connect the detection circuit 150. After the conductive probes 140 reach the detection position, the detection device may determine whether the wire 200 is in the predetermined position according to whether the detection circuit 150 is connected. When the two conductive probes 140 are in contact with the exposed conductor 201 and the detection circuit 150 is connected, it may determine that the detected conductor 201 is in the predetermined position; When the two conductive probes 140 are not all in contact with the exposed conductor 201, the detection circuit 150 is disconnected, and it may determine that the detected conductor 201 is not in the predetermined position. Whether the detection circuit 150 is connected or not can be prompted by light and sound devices. For example, a light or sound alarm is set in the detection circuit 150. If the detection circuit 150 is connected, the lamp will light up or the sound alarm will sound to remind the operator that the detection circuit is connected. In addition, the electrical signal of the detection circuit 150 can be used as the condition of the next processing. The detection circuit 150 is connected and outputs the electrical signal, and the upper computer controls the next processing equipment to continue to work according to the electrical signal; If the detection circuit 150 is not connected, the electrical signal will not be output, and the upper computer controls the next processing equipment not to work.

Figure 6:
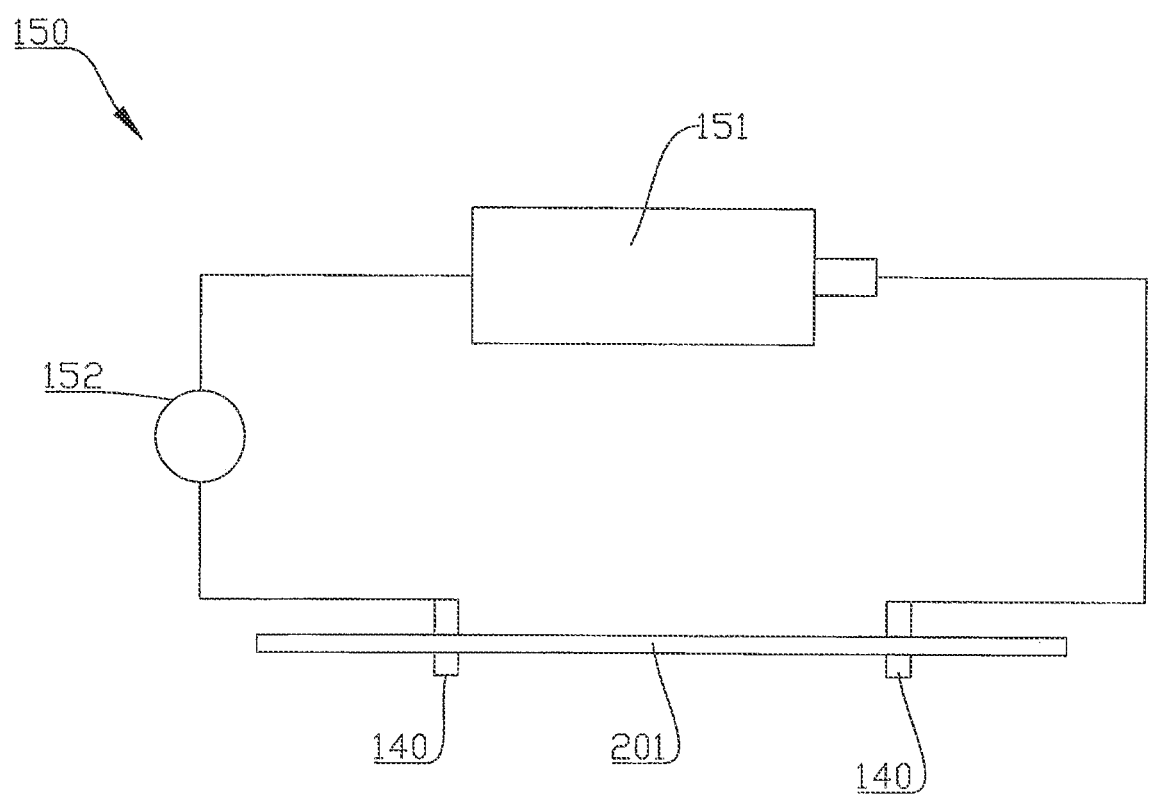
FIG. 6 is an illustrative function block diagram of a detection circuit according to an exemplary embodiment of the present invention.

FIG. 6 shows a schematic diagram of a detection circuit 150, which includes a power supply 151 and a lamp 152, and the power supply 151 and the lamp 152 are electrically connected. The conductive probe 140 can be electrically connected to the detection circuit 150 either through the swing arm 141 or through a wire. When the two conductive probes 140 are electrically connected by the exposed conductor 201, the detection circuit 150 is connected and the lamp 152 is lighted. When the exposed conductor 201 does not contact with the two conductive probes 140 and the conductive probes 140 are not electrically connected, the detection circuit 150 is disconnected and the lamp 152 is not lighted.

Taking the connection processing of two bundles of wires 200 as an example, each bundle of wires can be either one or multiple. The detection device for detecting the position of the conductor in the invention can be used for detecting both the exposed conductor of the wire covered with insulating skin and the conductor without insulating skin. When the detection device for detecting the conductor position is used, the conductive probe 140 can be set at the detection position in advance, and after the detection is completed, the conductive probe 140 may be moved away from the detection position by swinging the swing arm 141. Since the extension spring 146 is provided, the conductive probes 140 can be moved towards the wire 200 and moved over the conductor 201 after hitting the conductor 201. When the conductive probes 140 hit the conductor 201, the conductive probes 140 are rotated around the first pin 145 and moved over the conductor 201.

The detection device for detecting the position of the conductor in the invention can be applied in the wire processing, and the wire processing equipment is formed together with the heat shrinkable machine. The detection device for detecting the conductor position detects whether the exposed conductor is in the predetermined position. If the conductor is in the predetermined position, the heat shrinkable machine works, and the insulating heat shrinkable tube is sheathed on the exposed conductor and the exposed conductor is covered by the insulating heat shrinkable tube.

In an exemplary embodiment of the present invention, there is also provided a method for detecting position of a conductor 201 in wire processing. The method mainly comprises steps of:

S100: fixing a wire 200 to be processed, wherein the wire 200 comprises an exposed conductor 201; and S200: detecting whether the exposed conductor 201 is in a predetermined position, wherein if the exposed conductor 201 is not in the predetermined position, the position of the exposed conductor 201 is adjusted and detected again until the exposed conductor 201 is in the predetermined position.

In an embodiment, the step S200 may comprises steps of:

providing a detection circuit 150, wherein when the wire 200 is in the predetermined position, the detection circuit 150 is electrically connected with the exposed conductor 201; to and detecting whether the detection circuit 150 is connected to determine whether the processed wire 200 is in the predetermined position.

The invention relates to a detection device for detecting the conductor position, a wire processing device and a method for detecting the conductor position in wire processing. A plurality of conductive probes is arranged in the detection circuit. When the conductor is in the predetermined position, the plurality of conductive probes can contact with the conductor, and the plurality of conductive probes can be electrically connected through the conductor, and the detection circuit is connected; If the conductor is not in the predetermined position, the conductive probes cannot all contact with the conductor, and the detection circuit is disconnected. Therefore, it can judge whether the conductor is in the predetermined position according to whether the detection circuit is connected or disconnected. Whether the detection circuit is connected or not can be prompted by light and sound devices. For example, a light or sound alarm is set in the detection circuit. If the detection circuit is connected, the lamp will light up or the sound alarm will sound to remind the operator that the detection circuit is connected. In addition, the electrical signal after the detection circuit is connected can also be used as the condition for the next step of processing, the detection circuit is connected, the electrical signal is output, and the upper computer controls the next step of processing equipment to continue to work according to the electrical signal; If the detection circuit is not connected, the electrical signal will not be output, and the next processing equipment will not work under the control of the upper computer.

The detection device for detecting the conductor position, the wire processing equipment and the method for detecting the conductor position in the wire processing of the invention can automatically detect whether the conductor is in the predetermined position, which provides a basis for further automatic processing of the wire. By swinging the conductive probe through the swinging mechanism, the conductive probe can be swung to the detection position and moved away from the detection position after the detection, so as to avoid the influence of the conductive probe on the next processing operation. The conductive probe and the swing arm can be set relatively movably. In the detection, if the pressure of the conductive probe against the conductor is too large, the conductive probe may move relative to the swing arm, which can not only make the conductive probe and the conductor contact closely, but also avoid the conductor or the conductive probe from being damaged due to the excessive force exerted by the conductive probe on the conductor. The elastic reset device can help the conductive probe reset, and it will not be unable to continue the detection due to the movement of the conductive probes relative to the swing arm. The elastic reset device adopts a tension spring, which makes the structure of the invention simple and easy to implement. As the support structure of the swing arm, the main shaft makes the swing arm swing and can be installed. The structure is simple and easy to implement. The mounting seat and the transmission block can be linked circumferentially by setting the auxiliary shaft, so that the technical scheme of the invention can be implemented. The mounting seats are respectively arranged on both sides of the transmission block, and are respectively connected with the main shaft through the reverse threads, so that the spacing of the mounting seats can be adjusted when the main shaft rotates. The main shaft is equipped with a compression spring, which can eliminate the thread gap, keep the position stable, and avoid shaking in the detection and affect the detection effect. The air cylinder is used as the driving device, which is easy to implement and simple in structure.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A detection device for detecting a position of a conductor,
comprising:
a bracket;
a plurality of conductive probes provided on swing arms on the bracket and spaced from each other; and
an elastic reset device for holding the conductive probes in an initial state;
wherein the conductive probes have a detection position, and the detection device is configured to determine whether the detected conductor is in a predetermined position by detecting whether the conductive probes at the detection position are electrically connected through the conductor,
wherein when at least two conductive probes are electrically connected with each other through the detected conductor, the detected conductor is determined in the predetermined position,
wherein when no two conductive probes are electrically connected with each other through the detected conductor, the detected conductor is determined not in the predetermined position;
wherein after the conductive probes deviate from the initial state relative to the swing arms, the elastic reset device resets the conductive probes to the initial state.

2. The detection device according to claim 1, further comprising:
a detection circuit electrically connected with the conductive probes,
wherein when at least two conductive probes are in contact with the detected conductor, the detection circuit is connected, and the detected conductor is determined in the predetermined position;
wherein when no two conductive probes are in contact with the detected conductor, the detection circuit is disconnected, and the detected conductor is determined not in the predetermined position.

3. The detection device according to claim 2, wherein the detection circuit is in electrical contact and connection with the conductive probes.

4. The detection device according to claim 1, further comprising:
a swing mechanism supported on the bracket and comprising the swing arms,
wherein the conductive probes are connected to the swing arms, the swing arms are configured to swing to drive the conductive probes to move toward or away from the detection position.

5. The detection device according to claim 4, wherein the conductive probes are in electrical contact and connection with the swing arms, the swing arms are electrically connected with the detection circuit.

6. The detection device according to claim 4, wherein the conductive probes and the swing arms are configured to be movable relative to each other.

7. The detection device according to claim 1,
wherein the conductive probes are rotatably provided on the swing arms through a first pin shaft so that the conductive probes are rotatable relative to the swing arms;
wherein the elastic reset device is a tension spring, one end of which is connected to the swing arms, and the other end is connected to the conductive probes;
wherein after the conductive probes deviate from the swing arms, the extension spring resets the conductive probes.

8. The detection device according to claim 5, further comprising:
a main shaft rotatably supported on the bracket,
wherein the swing mechanism comprises a mounting seat and a driving device, the mounting seat is rotatably supported on the main shaft and fixedly connected with the swing arm;
wherein the driving device drives the swing arm to swing by directly driving the mounting seat or by driving the mounting seat through a transmission mechanism.

9. The detection device according to claim 8,
wherein the swing mechanism further comprising:
a transmission block rotatably mounted on the main shaft; and
a secondary shaft passes through the transmission block and the mounting seat so that the transmission block and the mounting seat are provided in circumferential linkage,
wherein the driving device directly drives the transmission block to rotate or drives the transmission block to rotate through a transmission mechanism,
wherein the mounting seat is driven to rotate when the transmission block is rotated, and the swing arm is driven to swing when the mounting seat is rotated.

10. The detection device according to claim 9,
wherein the swing mechanism comprises a plurality of mounting seats respectively arranged on both sides of the transmission block for mounting the swing arm, the plurality of mounting seats are matched and connected with the main shaft through reverse threads;
wherein when the main shaft is rotated, the mounting seats on both sides of the transmission block drives the swing arm to move close to or away from each other.

11. The detection device according to claim 8,
wherein a compression spring is sleeved on the main shaft, one end of the compression spring butts against the bracket, and the other end butts against the mounting seat.

12. The detection device according to claim 8,
wherein the driving device is an air cylinder, and the air cylinder is rotatably connected to the bracket through a second pin shaft;
wherein the air cylinder is provided with a retractable piston rod, and the piston rod is rotatably connected with the transmission block;
wherein the transmission block and the main shaft are driven to rotate when the piston rod extends or retracts, and the transmission block drives the mounting seat to rotate through the secondary shaft when the transmission block is rotated.

13. A wire processing equipment, comprising:
a wire processing device; and
the detection device according to claim 1,
wherein the detection device is used for detecting position of a conductor of the wire before the wire is processed.

14. The wire processing equipment according to claim 13,
wherein the wire processing device is a wire heat shrinkable machine;
wherein when the detection device determines that the detected wire is in the predetermined position, the conductive probes move away from the detection position to allow the wire to be processed by the wire heat shrinkable machine.

15. A detection device for detecting a position of a conductor, comprising:
a bracket;
a main shaft rotatably supported on the bracket;
a plurality of conductive probes provided on the bracket and spaced from each other; and
a swing mechanism supported on the bracket and having swing arms;
wherein the swing mechanism have a mounting seat and a driving device, the mounting seat is rotatably supported on the main shaft and fixedly connected with the swing arms;
wherein the driving device drives the swing arms to swing by directly driving the mounting seat or by driving the mounting seat through a transmission mechanism;
wherein the conductive probes have a detection position, and the detection device is configured to determine whether the detected conductor is in a predetermined position by detecting whether the conductive probes at the detection position are electrically connected through the conductor,
wherein when at least two conductive probes are electrically connected with each other through the detected conductor, the detected conductor is determined in the predetermined position,
wherein when no two conductive probes are electrically connected with each other through the detected conductor, the detected conductor is determined not in the predetermined position.

* * * * *